United States Patent [19]
Lau et al.

[11] Patent Number: 5,553,023
[45] Date of Patent: Sep. 3, 1996

[54] MEMORY PARTITIONING

[75] Inventors: Winnie K. W. Lau, Shapin, Hong Kong; Richard Malinowski, Placerville, Calif.

[73] Assignee: LSI Logic Corporation, Milpitas, Calif.

[21] Appl. No.: 421,321

[22] Filed: Apr. 13, 1995

Related U.S. Application Data

[63] Continuation of Ser. No. 362,409, Dec. 23, 1994.
[51] Int. Cl.$^6$ .................................................. G11C 13/00
[52] U.S. Cl. ............................ 365/189.01; 365/189.05; 365/230.03
[58] Field of Search .......................... 365/189.01, 189.02, 365/189.05, 230.03, 230.04, 230.08, 230.02

[56] References Cited

U.S. PATENT DOCUMENTS 3,753,242   8/1973   Townsend ........................ 365/189.01

*Primary Examiner*—Terrell W. Fears
*Attorney, Agent, or Firm*—Riches, McKenzie & Herbert

[57] ABSTRACT

This invention relates to an improved memory storage system which allows selective ranges of memory locations, which can also be referred to as virtual memory banks, to be enabled and disabled. The ranges of memory locations can be disabled to avoid refreshing unused memory location and to eliminate faulty memory locations. Also, the ranges of memory locations can be treated as blocks or banks of memory regardless of the physical chips used to store the data. In other words, if a memory bank has a capacity of 16 MB, the range of memory locations may be a portion of the total capacity of this memory bank, for example 8 MB or 4 MB, and the remainder of the memory bank can be unaffected or be the subject of another range of memory locations. In a preferred embodiment, the ranges of memory locations is at least 2 MB in size.

14 Claims, 3 Drawing Sheets

MEMORY PARTITIONING

RELATED APPLICATIONS

This is a continuation of U.S. application Ser. No. 08/362,409 filed Dec. 23, 1994, pending.

BACKGROUND OF THE INVENTION

This invention relates to computer systems and more particularly improved data storage systems for use in computer systems. More particularly, this invention relates to an improved memory controller which permits memory storage locations to be grouped in any manner required for the best execution of the program or to meet other objectives.

In the past, computer systems have provided for mapping out main memory such as by orienting banks of memory in logical main memory. However, the prior art was limited such as by only permitting an entire bank of memory to be mapped in one area of logical memory without permitting a portion of a memory bank to mapped in one location in logical memory. For example, the prior art devices did not permit a programmer to fill a hole in logical memory which was smaller than the physical capacity of a memory bank, or, to separate one memory bank two fill two separate holes in memory.

In addition, many prior art devices did not permit sections of main memory to be "turned off" or disabled to avoid unnecessarily refreshing portions of main memory which are not being used, and which will not likely be used in the near future. Also, many prior art devices did not allow sufficient flexibility to avoid faulty memory locations without causing the entire system to fail.

In other words, prior art devices did not allow the programmer to independently and arbitrarily group memory locations by simply defining the upper and lower boundary of a memory bank, or virtual memory bank, and manipulate or map this virtual memory bank in anyway desired for efficient operation of the computer system or to provide groups of memory locations for use by the program of operating system.

SUMMARY OF THE INVENTION

Accordingly, it is an object of this invention to at least partially overcome the disadvantages of the prior art. Also, it is an object of this invention to provide an alternative type of memory controller to provide better and more versatile control of main memory.

Accordingly, in one of its aspects, this invention resides in providing in a computer system having an address bus and a data bus, a memory storage system comprising: main memory means comprising a plurality of memory locations for storing groups of data from the data bus and later retrieving the groups of data, each memory location having a unique address and being addressable by signals on the address bus; memory controller means for controlling the storage of dam to the main memory means from the data bus retrieval of data from the main memory, and for organizing each memory location onto a memory map comprising all addresses addressable by the computer system, said memory controller means comprising: virtual bank registrar means for storing a first address associated with a first memory location and a second address associated with a second memory location different from the first memory location, said first and second addresses defining a lower boundary and a higher boundary, respectively, of a first virtual memory bank, said virtual memory bank comprising all memory locations having addresses between the lower boundary and the higher boundary; and enable indication means for indicating whether the virtual memory bank is enabled or disabled; and wherein the memory controller means maps all of the memory locations in the first virtual memory bank to a first area on the memory map.

Further aspects of the invention will become apparent upon reading the following detailed description and the drawings which illustrate the invention and preferred embodiments of the invention.

BRIEF DESCRIPTION OF THE DRAWINGS

In the drawings, which illustrate embodiments of the invention.

DETAILED DESCRIPTION OF PREFERRED EMBODIMENTS OF THE INVENTION

Figure 1:
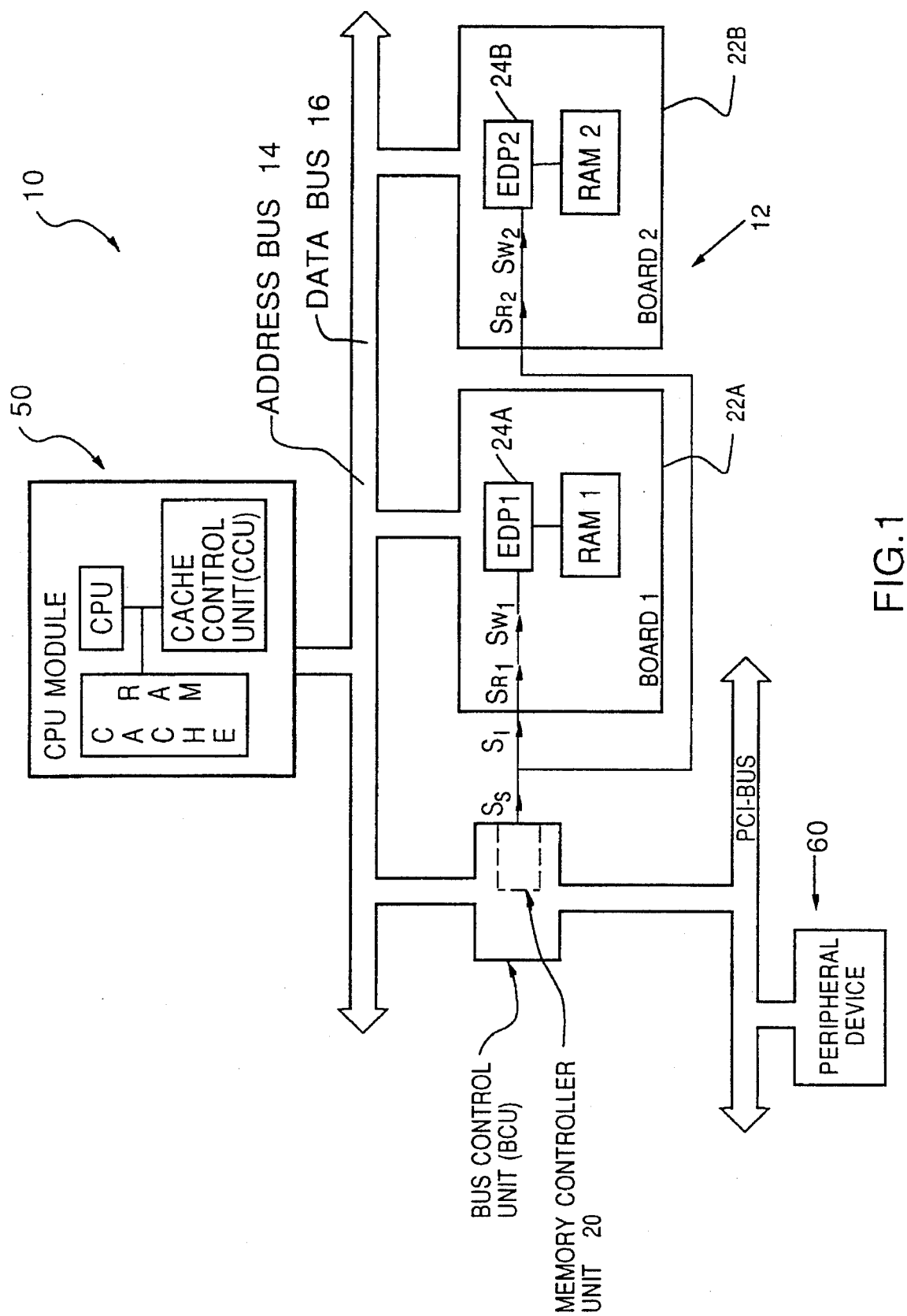
FIG. 1 shows a schematic representation of a computer system incorporating the memory storage system of the present invention.

FIG. 1 shows a computer system, shown generally by reference numeral 10, having a memory system, shown generally as 12. The memory system 12 which comprises several actual memory banks, two of which are shown in FIG. 1 as RAM1 and RAM2. The memory devices RAM1 and RAM2 comprise several memory locations to store and retrieve groups of data, as is known in the art. In general, the groups of data can be bytes, words, or other combinations of bits.

Each memory bank RAM1 and RAM2 comprises one or more self-contained chips having independent connections to the address bus 14 and data bus 16. The chips are generally dynamic random access memory chips of different sizes, such as 256 KBs, 1 MB, 4 MB or 16 MB.

Computer system 10 comprises a central processing unit ("CPU") shown on a CPU module 50. The CPU module 50 also comprises a cache RAM and a cache control unit CCU for interfacing with the address bus 14 and data bus 16. In a preferred system 10, the additional CPU modules 50 can be connected included in the system 10, each running symmetrically.

In a preferred embodiment, as shown in FIG. 1, the address bus 14 and data bus 16 are temporarily multiplexed and comprise the same lines. In this way, when data is stored or retrieved, the address is sent first and then the data is read from or written into the memory system 12 or a peripheral device 60 on at least some of the same lines upon which the address was sent. In a preferred embodiment, the data bus 16 comprises 64 lines and the address bus 14 comprises 32 lines, which are also the first 32 lines of the data bus 16.

As is also shown in FIG. 1, the system 10 comprises a bus control unit BCU for controlling the address bus 14 and data bus 16 as well as providing a buffer to the peripheral component bus PCI. In addition, the bus control unit BCU comprises a memory controller unit 20 which sends control signals $S_R$ and $S_W$ to the memory banks RAM1 and RAM2 to control the read and write operations to and from memory locations within memory banks RAM1 and RAM2.

The memory controller unit 20 provides write control signals $S_W$ and read control signals $S_R$ to control the storing and retrieval of data in the memory system 12, including memory units RAM1 and RAM2. Memory controller unit 20 sends a write control signal $S_W$ to a memory unit, RAM1 or RAM2, to cause the memory unit, RAM1 or RAM2, to store the data presented on the data bus 16. Likewise, memory controller unit 20 sends a read control signal $S_R$ to the memory units, RAM1 or RAM2, to retrieve data stored in the memory units, RAM1 or RAM2.

It is understood that while the present discussion relates to only two memory units, RAM1 and RAM2, several such memory units may be incorporated in the memory system 12 and each would be controlled by the memory controller unit 20 in a similar manner to that described above with respect memory banks RAM1 and RAM2.

The buffers 24a and 24b in a preferred embodiment are data pipeline chips ("EDP chip"). The EDP chip comprises error correction circuitry ("ECC") as well as write buffers and prefetch buffers to assist in interfacing with the data bus 16.

In particular, when the error correction circuitry of the EDP chip is operational it generates 8 bits representing the error correction code for each 64 bits of data to be stored. As the memory data bus is 128 bits wide, there are 16 bits of error correction code with each 128 bits of data, thereby creating a data bank size of 144 bits. However, the error correction codes are only used by the EDP chip and do not appear on the data buses.

The buffers 24a and 24b are located between the first and second memory units RAM1 and RAM2 and the data bus 16. It is apparent that one buffer 24a or 24b is required for each memory board 22a or 22b. In the preferred embodiment, as shown in the attached appendix B, the EDP chip accommodates only 64 bits of data, and therefore each buffer 24a and 24b comprises two EDP chips to accommodate the entire 128 bits of data on the memory data bus, but other arrangements are possible.

In the embodiment shown in FIG. 1, the memory units RAM1 and RAM2 are shown on separate boards, namely boards 22a and 22b, respectively. In this embodiment, the memory controller unit 20 comprises separate lines to select each of the boards 22a and 22b separately, and can also simultaneously select both boards 22a and 22b.

In a preferred embodiment, the computer system 10 comprises slots for insertion of up to four memory boards (not shown). The memory controller 20 has 2 lines called SLOTSEL[1:0] which are connected to the EDP chips and select a target slot of the four possible slots. In one mode of operation, the memory controller unit 20 supports interleaving between two separate boards 22a and 22b, in which case two boards are selected by the memory controller unit 20. In another mode of operation, the memory controller unit 20 supports interleaving between memory units on the board 22, in which case only the board having the memory units RAM1 and RAM2 would be selected.

The memory controller means 20, in one preferred embodiment, sends other interfacing control signals $S_I$ to the buffer means 24a and 24b. These interfacing control signals $S_I$ include the select signals $S_S$ which select the buffer means 24a and 24b. The interfacing control signals $S_I$ also configure the buffer means 24a and 24b for different modes of operation such as interleaving or non-interleaving, error correction or non-error correction, and other modes of operation.

Figure 2:
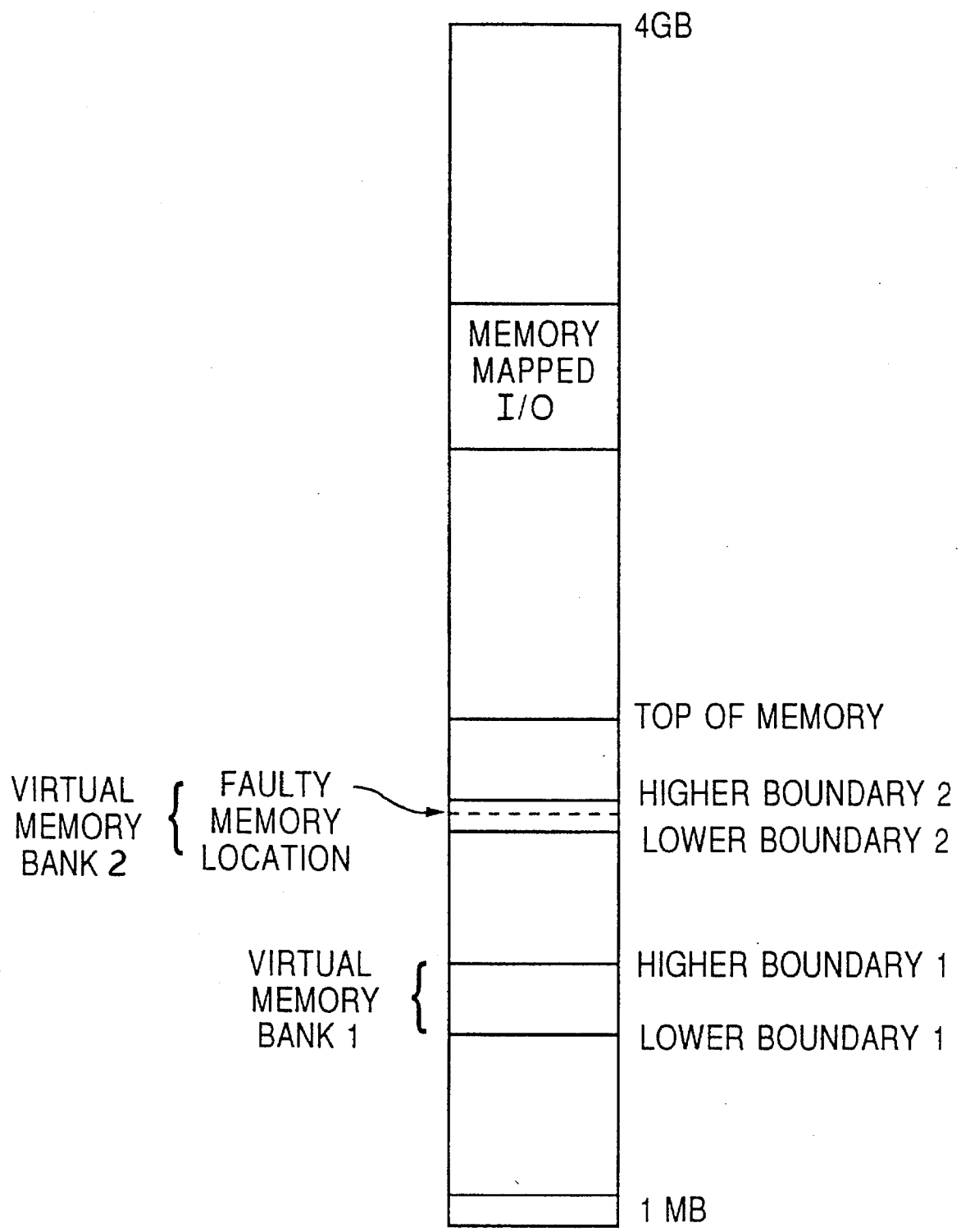
FIG. 2 shows a diagramatic representation of logical memory according to one embodiment of the present invention.

FIG. 2 shows a diagrammatic representation of logical addressable memory according to one embodiment of the present invention. As stated above, in a preferred embodiment, the address bus 14 comprises 32 lines to transfer 32 bits of information. Accordingly, the system 10 shown in FIG. 1 can select $2^{32}$ or 4 billion logically addressable bytes. In other words, the system 10 has a potential logical addressable memory of 4 GBs.

The main memory system, shown generally as 12 in FIG. 1, maps to the lower part of the CPU logical memory map. Preferably, the lower boundary of the memory subsystem 12 is logical memory address zero and the upper boundary is defined by the address in the Top of Memory register (MTOP-OF-MEMORY). In a preferred embodiment, the Top of Memory register is located in the memory controller 20.

The value in the top of memory register has different meanings for different devices on the address bus 14. For the memory controller unit 20, the value in the top of register indicates the top address boundary of contiguous or non-contiguous memory in the memory subsystem 12 attached to the address bus 14 and data bus 16. In general, resolution of 1 MB for the address of top of memory register is sufficient. In a preferred, the system 10 can support several CPU modules 50 operating off the same address bus 14 and data bus 16. In this embodiment, the address bus 14 and a data bus 16 is collectively referred to as the multiprocessor interconnect bus ("MPI-Bus") described in more detail in the attached Appendices A and B.

In one preferred embodiment, the memory controller unit 20 comprises at least one, and preferably a plurality of registers referred to generally as memory controller virtual bank descriptor registers or virtual memory bank registers. One such register is shown marked as 80 in FIG. 3 and another is shown marked as 80'. In a preferred embodiment, the memory controller unit 20 has 32 separate virtual memory bank registers 80. In a preferred embodiment, each virtual memory bank register 80 comprises 32 bits, but could be designed to comprise more or less bits depending on the specific requirements of the system 10.

Figure 3:
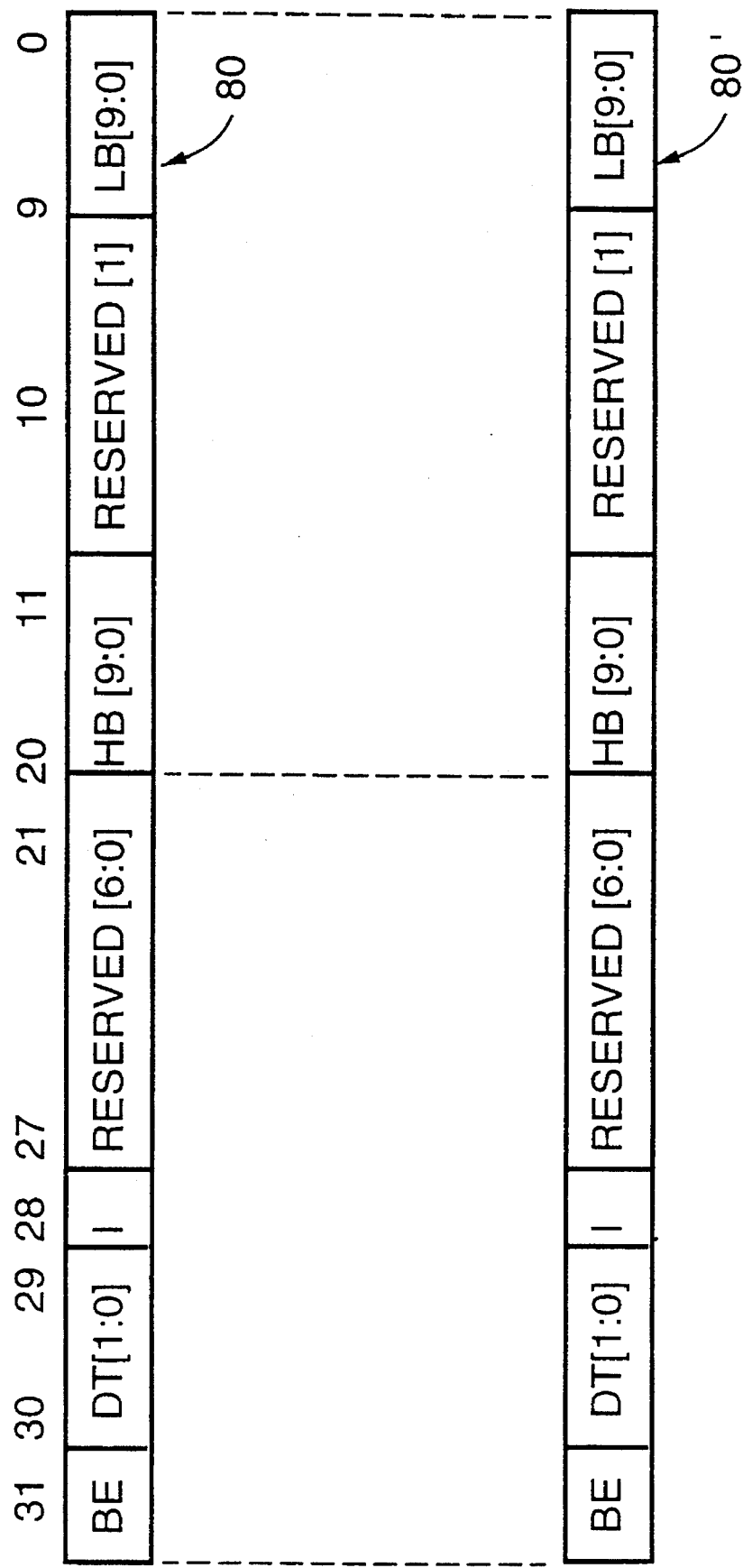
FIG. 3 shows a virtual bank descriptor register in one embodiment of the present invention.

As shown in FIG. 3, the lower 10 bits of register 80, namely bits 0 to 9, are labelled as lower boundary or LB bits and specify a first memory location in the memory subsystem 12 corresponding to a lower memory boundary. Preferably, the LB9 bit corresponds to memory address line 30, the LB8 bit corresponds to memory address line 29 and so on until bit LB0 which corresponds to memory address 21. The value of the lower order bits in the address of the first memory have a default value of zero. This means that the lower boundary address specified by the LB bit has a 2 MB resolution in this embodiment as the lower 21 lines of the address always have the default value of zero and cannot be altered.

The highest order address line, namely memory address 31, is also not set by the register 80 and has a default value of zero as well. This conforms with the mapping of the memory subsystem 12 to the lower part of the logical memory as referred to above in this embodiment.

Likewise, bits 11 to 20 of register 80 specify a second memory location in the memory subsystem 12 corresponding to a higher memory boundary and are labelled as higher boundary or HB bits. The HB bits correspond to memory address lines 30 to 21 in the same manner as the bits marked as LB in the register 80. The value of the other bits corresponding to the higher boundary memory, namely the values on address lines 31 and 20 to 0 have a default value of zero as was the case with the lower boundary memory. Therefore, the bits in the LB portion of register 80 and the bits in the HB portion of register 80 each define a memory location in the lower part of logical addressable memory, and more particularly within the memory locations occupied the memory subsystem 12 in the logical addressable memory, to within a 2 MB resolution.

It is apparent that provided the values of the LB bits in the register 80 do not equal the value of the bits in HB in the register 80, a range of memory locations will be specified between the lower boundary location and the higher boundary location. Preferably, the address of the memory location specified by the lower boundary or by the lower boundary bits LB will be lower in the logical memory map shown in FIG. 2 than the address specified by the higher boundary bits HB. In so doing, register 80 defines a virtual memory bank comprising all the memory locations between the lower boundary memory location and the higher boundary memory location.

These memory locations are also shown in FIG. 2 as arranged on the logical addressable memory located between the 1 MB address and the top of memory address which is stored in the Top of Memory register in the memory controller 20. As shown in FIG. 2, the Lower Boundary 1 and the Higher Boundary define a continuous range of memory locations having addresses between these two boundaries thereby defining Virtual Memory Bank 1.

In a preferred embodiment, the memory location at the lower boundary address is considered included within the range of memory locations. Therefore, in this embodiment, the Lower Boundary 1 forms part of this Virtual Memory Bank 1 while the memory location of the Higher Boundary 1 is considered not to be part of the Virtual Memory Bank 1.

Referring again to FIG. 3, bit 31 of the register 80 is a bank enable BE bit and defines whether or not the virtual bank defined by the lower boundary and higher boundary is enabled or disabled. For example, if the bank enable BE bit is zero, the virtual bank is disabled and if the bank enable BE bit is 1 then the bank is enabled.

By having the virtual bank enabled, the memory locations included within the virtual memory bank will be treated as one memory bank regardless of the relationship between the virtual memory bank and the actual memory banks comprising the memory subsystem 12. For example, the virtual memory bank defined by the lower boundary and the higher boundary memory locations could have a 4 MB size and define a portion of a chip or chips forming an actual memory bank having a 16 MB capacity. In other words, the virtual memory bank could be formed from a portion of a group of chips comprising an actual memory bank with a much larger capacity.

Likewise, if the virtual bank as defined by the lower boundary address and the higher boundary address is 4 MB in size but there are two or more actual memory banks within this range in order to form the 4 MB range then the virtual bank will comprise more than one actual memory bank.

It is apparent that the use of virtual memory banks greatly increases the versatility of the system, for example, by permitting the programmer or operating system to deal with groups or ranges of memory locations as a unit regardless of the actual memory banks or chips used to form those virtual memory banks. This permits the memory controller unit 20 to "fill holes" in the memory map of the memory subsystem 12 much more easily than if the memory controller unit 20 was restricted to using the capacity of the actual memory banks. For example, if there are two "holes" in the memory map of the memory subsystem 12 of 8 MB size, the memory controller unit 20 could form two 8 MB virtual memory banks of one actual memory bank having a 16 MB size and map separate portions to fill in the holes. This has several advantageous including permitting portions of programs to operate in contiguous memory within the memory system 12 by re-mapping the memory in memory system 12 more easily to obtain optimum performance of the system 10.

In addition, by being able to disable a range of memory locations corresponding to a virtual memory bank, it is possible to "turn off" a group of memory locations. One advantage of this, in particular where dynamic random access memory is being used, is that by disabling a range of memory locations corresponding to a virtual memory bank, the memory controller 20 need not refresh those memory locations until the virtual memory bank is enabled again. Such a situation may arise where it is clear that a substantial portion of the main memory 12 will not be used for an extended period of time. By not refreshing the unneeded memory locations, the overall power consumption of the system 10, as well as the heat generated by the memory subsystem 12 of the system 10, is greatly decreased. In addition, by not using the system 10 resources to refresh memory locations, the overall memory band width available to the system 10 is increased.

Another advantage arises when a faulty memory location has been identified and the system 10 cannot properly function if data is stored in this faulty memory location. A faulty memory location can be identified, for example, by the error correction circuitry ("ECC") included within the EDP chips and which in a preferred embodiment correspond to the buffers 24a and 24b. The ECC can determine if a single bit or multiple bit error has occurred and the address of the memory location where the error has occurred can be recorded. If a errors continually occur in a particular memory location, the system 10 may form a virtual memory bank comprising the faulty memory location and set the bank enable BE bit for the virtual bank comprising the faulty memory location to disable. The number of errors which may occur with data stored to a particular memory location before the memory location if considered faulty will depend on the tolerance of the system 10 and can be set by the operating system. It is not uncommon for a memory location to be labelled as faulty if two errors have occurred.

FIG. 2 shows a virtual memory bank defined by lower boundary 2 and higher boundary 2. This virtual bank encompasses the faulty memory location 82 which would have been determined to be faulty in part by the ECC. This virtual memory may now be disabled so that it is not refreshed and no additional data would be stored or retrieved from a memory location between the lower boundary 2 and the higher boundary 2 until the faulty memory location 82 is serviced and any problems associated with it corrected.

In this way, faulty memory location 82 need not be the cause of any additional lost data and operation of the system 10 is disrupted. The virtual memory bank comprising the faulty memory location 82 can remain disabled until serviced by a trained technician. As the remainder of the system 10 continues to operate even though there is a faulty memory location 82, there is no unnecessary down time to the system 10 and the technician need not immediately arrive. In particular, if there is only one faulty memory location 82, it is possible that a special service trip by a technician not occur and virtual memory bank comprising the faulty memory location 82 can remain disabled during a general maintenance visit.

It is preferable when forming a virtual memory bank to avoid or to disable a faulty memory location 82, that the virtual memory bank be the smallest size possible. In a preferred embodiment where the resolution of the lower boundary location and higher boundary location is 2 MB, the smallest size of a virtual memory bank can have is 2 MB. Therefore, to avoid the faulty memory location 82, 2 MB of data would effectively be removed from the system 10. However, this would be the case regardless of the size of the actual memory bank containing the faulty memory location 82. For example, if the faulty memory location 82 occurred within an actual memory bank having a capacity of 8 MB, only 2 2MB of the actual memory bank would be removed and the other 6 MB of the actual memory bank which are not included in the virtual memory bank could continue to operate. This type of situation is shown in FIG. 2 where a faulty memory location is shown being located between lower boundary 2 and higher boundary 2 in the logical addressable memory.

Therefore, when avoiding a faulty memory location 82, it is preferred that the lower boundary memory location be as near to the upper boundary memory location as possible, which in the preferred embodiment is 2 MB apart.

In a further preferred embodiment, there are more than one registers 80 and more preferable a plurality of registers 80. In a preferred embodiment, there are 32 registers 80 each capable of defining a virtual memory bank having various sizes by placing specific values for the lower boundary bits LB and the higher boundary bits HB in the registers 80. If there are no values in the lower boundary bits and the higher boundary bits, or if these values are equal to each other, then there is no virtual memory location specified. In general, these values will be stored by the operating system.

It is preferred that the lower boundary and higher boundary of each virtual memory bank do not overlap so that each memory location in the memory subsystem 12 can be no more than one virtual memory bank. As stated above, it is preferred that the memory location corresponding to the upper boundary is not considered included in the virtual memory bank while the lower boundary is considered to be included. Therefore, it is possible for the upper boundary of one virtual bank to be the lower boundary of another virtual bank without a memory location appearing or being present in two virtual memory banks.

The other bits in the register 80 assist the memory controller unit 20 to map the actual memory banks and the virtual memory banks and to control the memory storage to the memory subsystem 12. For example, bits 30 and 29, in a preferred embodiment, are dram type DT bits and configure the type of dram used in the bank. For example, the dram type bits DT could be set to indicate a 16 MB dram both bits are high "11" a 4 MB dram when bit 30 is high and bit 29 is low "10" or other values to indicate other dram types Bit 28 of register 80 is an interleaved bit I which shows whether or not the virtual bank defined by the lower boundary bits LB and higher boundary bits HB is interleaved with another virtual bank. If interleaving has occurred, it is preferred that the size of the virtual memory banks, namely the range of memory locations located between the lower boundary LB and the higher boundary HB for each of the virtual memory banks interleaved, be equal. It is also preferred when interleaving that the virtual banks have adjacent row address/lines. In a preferred embodiment, an interleaved bit I value of zero indicates that the virtual bank is not interleaved while a value of 1 indicates two-way interleaving enabled.

Bits 10 and 21 to 27 of virtual bank register 80 are reserved for other uses.

It will be understood that, although various features of the invention have been described with respect to one or another of the embodiments of the invention, the various features and embodiments of the invention may be combined or used in conjunction with other features and embodiments of the invention as described and illustrated herein.

Although this disclosure has described and illustrated certain preferred embodiments of the invention, it is to be understood that the invention is not restricted to these particular embodiments. Rather, the invention includes all embodiments which are functional, electrical or mechanical equivalents of the specific embodiments and features that have been described and illustrated herein.

The embodiments of the invention in which an exclusive property or privilege is claimed are defined as follows:

1. In a computer system having an address bus and a data bus, a memory storage system comprising:

main memory means comprising a plurality of memory locations for storing groups of data from the data bus and later retrieving the groups of data, each memory location having a unique address and being addressable by signals on the address bus;

memory controller means for controlling the storage of data to the main memory means from the data bus retrieval of data from the main memory, and for organizing each memory location onto a memory map comprising all addresses addressable by the computer system, said memory controller means comprising:

virtual bank register means for storing a first address associated with a first memory location and a second address associated with a second memory location different from the first memory location, said first and second addresses defining a lower boundary and a higher boundary, respectively, of a first virtual memory bank, said virtual memory bank comprising all memory locations having addresses between the lower boundary and the higher boundary; and enable indication means for indicating whether the virtual memory bank is enabled or disabled; and wherein the memory controller means maps all of the memory locations in the first virtual memory bank to a first area on the memory map.

2. A memory storage system as defined in claim 1 wherein the first memory location and the second memory location are located in a first actual memory bank having a number of memory locations and the virtual memory bank comprises a portion of the memory locations of the actual memory bank.

3. A memory storage system as defined in claim 1 wherein the first memory location is located in a first actual memory bank having a number of memory locations and the second memory location is located in a second actual memory bank having a number of memory locations and separate from the first actual memory bank.

4. A memory storage system as defined in claim 1 wherein the main memory means comprises memory devices requiring periodic refreshing and wherein the memory locations of the first virtual memory location are not refreshed if the enable indication means indicates the virtual memory bank is disabled.

5. A memory storage system as defined in claim 4 wherein the first memory location is located in a first actual memory bank having a number of memory locations and the second memory location is located in a second actual memory bank having a number of memory locations and separate from the first actual memory bank.

6. A memory storage system as defined in claim 1 further comprising error detection means for detecting errors in data stored in a memory location in the main memory means, wherein if the error detection means detects errors in a faulty memory location, the computer system configures the lower boundary and the higher boundary to include the faulty memory location and the enable indication means for the first virtual memory bank is set to indicate disabled.

7. A memory storage system as defined in claim 6 wherein the computer system configures the lower boundary to be near the higher boundary.

8. A memory storage system as defined in claim 7 wherein the first memory location and the second memory location are located in a first actual memory bank having and a number of memory locations and the virtual memory bank comprises a portion of the memory locations of the actual memory bank.

9. A memory storage system as defined in claim 1 wherein the memory controller means further comprises:

a second virtual bank register means for storing a third address associated with a third memory location and a fourth address associated with a fourth memory location different from the third memory location, said third and fourth addresses defining a second lower boundary and a second higher boundary, respectively, of a second virtual memory bank comprising all memory locations between the second lower boundary and the second higher boundary; and enable indication means for indicating whether the second virtual memory bank is enabled or disabled;

wherein the memory controller means maps all of the memory locations in the second virtual memory bank to a second area on the memory map different from the first area; and wherein memory locations of the second virtual memory bank are not included within the first virtual memory bank.

10. A memory storage system as defined in claim 1 wherein the memory controller means further comprises:

a plurality of virtual bank register means for storing a pair of addresses of memory locations, each pair of addresses being different and each pair of addresses corresponding to a lower boundary and a higher boundary of a corresponding virtual memory bank comprising all memory locations between the corresponding lower boundary and higher boundary;

wherein each of the plurality of virtual bank register means comprises an associated enable indication means for indicating whether the associated virtual memory bank is enabled or disabled;

wherein the memory controller means maps all of the memory locations in each of the virtual memory banks to a different area on the memory map; and wherein each memory location is included in no more than one virtual memory bank.

11. A memory storage system as defined in claim 10 wherein each pair of memory locations of the plurality of pairs of addresses of memory locations need not be located in one memory chip.

12. A memory storage system as defined in claim 10 wherein each virtual memory bank includes the lower boundary memory location and does not include the higher boundary memory location, and wherein the higher boundary memory location of one of the virtual memory banks may also be the lower boundary memory location of another virtual bank memory.

13. A memory storage system as defined in claim 10 wherein each pair of memory locations are located in an actual memory bank having a number of memory locations and the corresponding virtual memory bank comprises a portion of the memory locations of the actual memory bank.

14. A memory storage system as defined in claim 12 wherein the pairs of addresses stored in the plurality of virtual bank register means are the more significant bits of an address and the other bits in the addresses are zero.

\* \* \* \* \*

UNITED STATES PATENT AND TRADEMARK OFFICE
CERTIFICATE OF CORRECTION

PATENT NO. : 5,553,023
DATED : September 3, 1996
INVENTOR(S) : WINNIE K.W. LAU and RICHARD MALINOWSKI It is certified that error appears in the above-indentified patent and that said Letters Patent is hereby corrected as shown below:

Column 1, line 24, after the word "bank" replace the word "two" with the word -- to --; Column 1, line 58, replace the word "dam" with the word -- data --; Column 3, line 33, delete the words "as shown in the attached appendix B,"; Column 4, line 4, replace the number "232" with -- $2^{32}$ --; Column 4, lines 26 to 27, delete the words "described in more detail in the attached appendices A and B."; Column 6, line 33, delete the word "a" after the word "if"; Claim 1, column 8, line 25, insert the words -- and the -- after the words "data bus"; and Claim 8, column 9, line 14, delete the word "and" after the word "having".

Signed and Sealed this

Sixth Day of May, 1997

BRUCE LEHMAN

*Attest:*

*Attesting Officer*       *Commissioner of Patents and Trademarks*